(12) United States Patent
Craig et al.

(10) Patent No.: US 7,244,326 B2
(45) Date of Patent: Jul. 17, 2007

(54) TRANSFER ASSEMBLY FOR MANUFACTURING ELECTRONIC DEVICES

(75) Inventors: Gordon S. W. Craig, Palo Alto, CA (US); Kenneth D. Schatz, San Jose, CA (US); Mark A. Hadley, Newark, CA (US); Paul S. Drzaic, Morgan Hill, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 103 days.

(21) Appl. No.: 10/846,753

(22) Filed: May 13, 2004

(65) Prior Publication Data

US 2005/0000634 A1    Jan. 6, 2005

Related U.S. Application Data

(60) Provisional application No. 60/471,422, filed on May 16, 2003.

(51) Int. Cl.
*B32B 37/00* (2006.01)

(52) U.S. Cl. .................. 156/234; 156/235; 156/238; 156/241

(58) Field of Classification Search .......... 156/230, 156/234, 235, 238, 241, 325, 326, 327, 538, 156/539, 540, 541, 542, 556
See application file for complete search history.

(56) References Cited

U.S. PATENT DOCUMENTS 3,439,416 A    4/1969    Yando
4,191,800 A    3/1980    Holtzman
4,514,583 A    4/1985    Izu et al.
4,966,442 A    10/1990   Ono et al.
5,034,802 A    7/1991    Liebes, Jr. et al.
5,436,744 A    7/1995    Arledge et al.
5,453,864 A    9/1995    Yamada et al.
5,545,291 A    8/1996    Smith et al.
5,772,905 A    6/1998    Chou
5,814,885 A    9/1998    Pogge et al.
5,824,186 A    10/1998   Smith et al.
5,904,545 A    5/1999    Smith et al.
5,925,259 A    7/1999    Biebuyck et al.
6,027,630 A    2/2000    Cohen (Continued)

FOREIGN PATENT DOCUMENTS

DE    31 27 120 A1    1/1983

(Continued)

OTHER PUBLICATIONS

PCT Search Report for PCT International Appln No. US2004/015237, mailed Nov. 5, 2004 (6 pages).

(Continued)

*Primary Examiner*—James Sells
(74) *Attorney, Agent, or Firm*—Blakely, Sokoloff, Taylor & Zafman LLP

(57) ABSTRACT

A method for assembling a device. The method comprises placing a functional element in a first opening formed in a template substrate and transferring the functional element to a device substrate having a second opening formed therein wherein the functional element is held within the second opening and against an adhesive film coupled to the device substrate.

64 Claims, 7 Drawing Sheets

U.S. PATENT DOCUMENTS

| | | | |
|---|---|---|---|
| 6,091,332 | A | 7/2000 | Eberhardt et al. |
| 6,094,138 | A | 7/2000 | Eberhardt et al. |
| 6,246,327 | B1 | 6/2001 | Eberhardt |
| 6,274,508 | B1 | 8/2001 | Jacobsen et al. |
| 6,281,038 | B1 | 8/2001 | Jacobsen et al. |
| 6,291,896 | B1 | 9/2001 | Smith |
| 6,316,278 | B1 | 11/2001 | Jacobsen et al. |
| 6,468,638 | B2 | 10/2002 | Jacobsen et al. |
| 6,555,408 | B1 | 4/2003 | Jacobsen et al. |
| 6,606,247 | B2 | 8/2003 | Credelle et al. |
| 6,665,044 | B1 | 12/2003 | Jacobsen et al. |
| 6,683,663 | B1 | 1/2004 | Hadley et al. |
| 6,731,353 | B1 | 5/2004 | Credelle et al. |
| 2001/0031514 | A1 | 10/2001 | Smith |
| 2002/0001046 | A1* | 1/2002 | Jacobsen et al. ............... 349/42 |

FOREIGN PATENT DOCUMENTS

| | | |
|---|---|---|
| DE | 39 11 612 A1 | 10/1990 |
| DE | 3911612 A1 * | 10/1990 |
| EP | 0 747 948 | 12/1996 |
| JP | 408160466 A | 6/1996 |
| JP | 8-300257 | 8/1996 |
| WO | WO 99/67678 | 12/1999 |

OTHER PUBLICATIONS

PCT Written Opinion for PCT International Appln No. US2004/015237, mailed Nov. 5, 2004 (5 pages).

Nakamura, Eiji, et al.; 37.3: Development of Electrophoretic Display Using Microcapsulated Suspension; SID International Symposium Digest of Technical Papers, US, Santa Ana, CA.; SID vol. 29, 1998; pp. 1014-1017.

Wu, C.C.; "Integration of Organic LED's and Amorphous Si TFT's onto Flexible and Lightweight Metal Foil Substrates;" IEEE Electron Device Letters, US, IEEE Inc., New York; vol. 18, No. 12, Dec. 1, 1997; pp. 609-612.

Search Report for PCT/US 99/30391 mailed May 23, 2000; 5 pages.

Verma, Ashish K., et al., Fluidic Self-Assembly of Silicon Microstructures, 1995, IEEE, 0569-5503/95/0000-1263, pp. 1263-1268.

Talghader, et al., "Integration of Fluidically Self-Assembled Optoelectronic Devices Using a Silicon-Based Process," 1995, IEEE Phontonics Technology Letters, vol. 7, No. 11, pp. 1321-1323.

PCT International Preliminary Report on Patentability for PCT Appln No. US2004/015237, mailed Dec. 1, 2005 (7 pages).

* cited by examiner

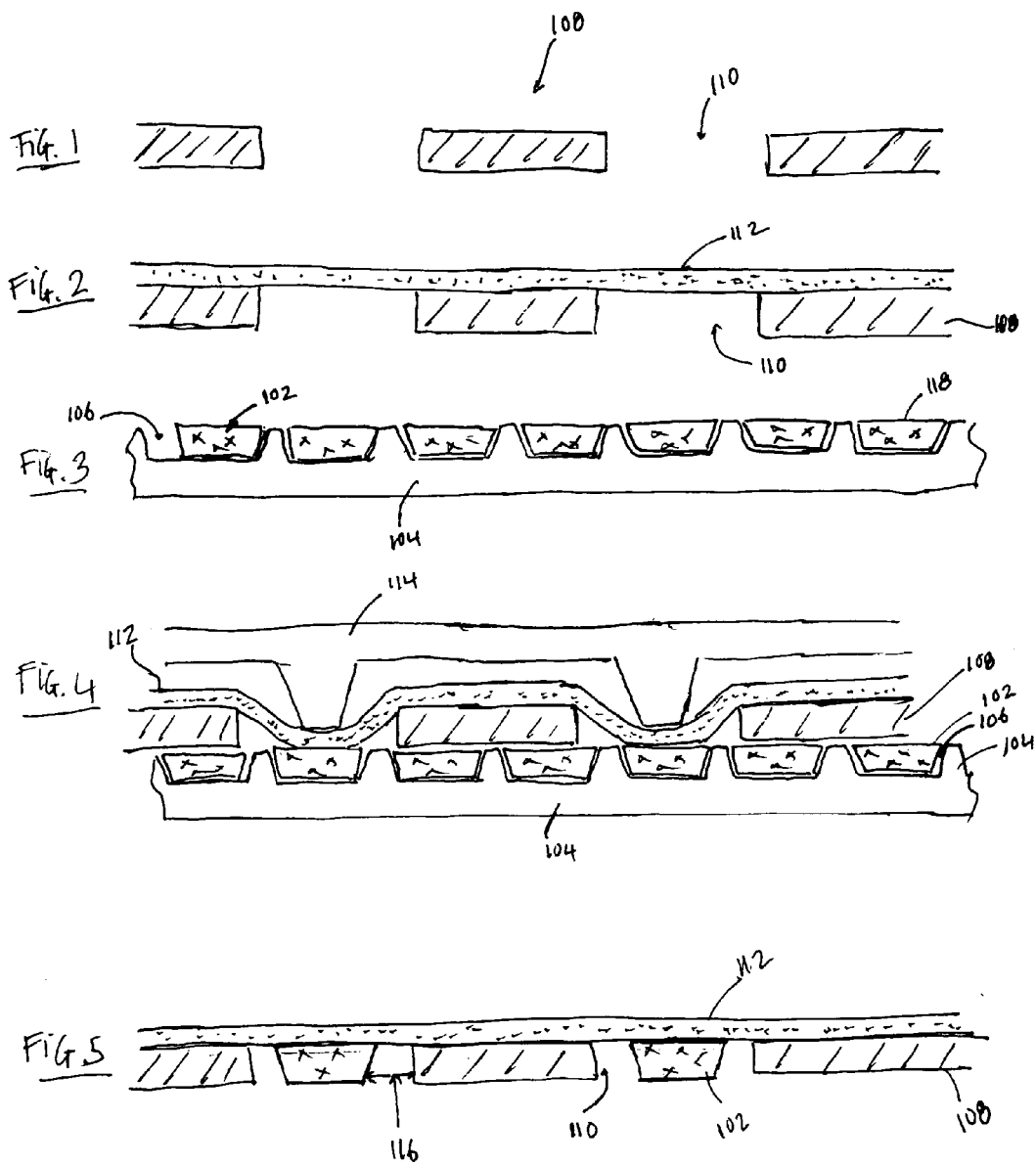

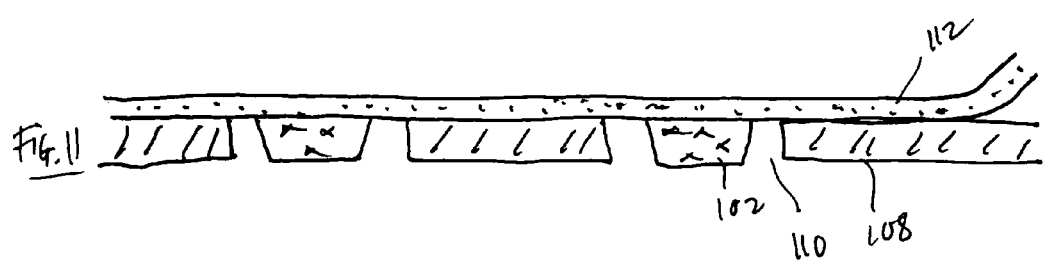
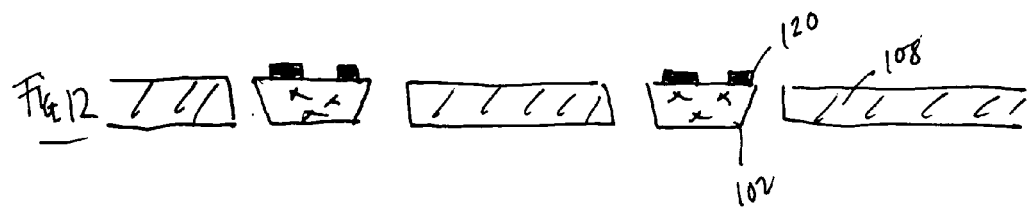
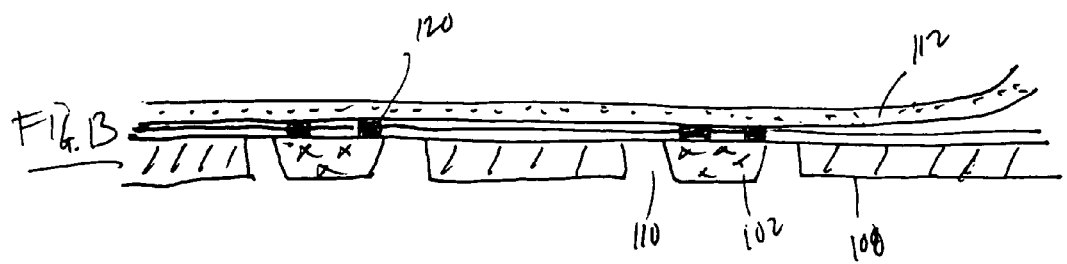

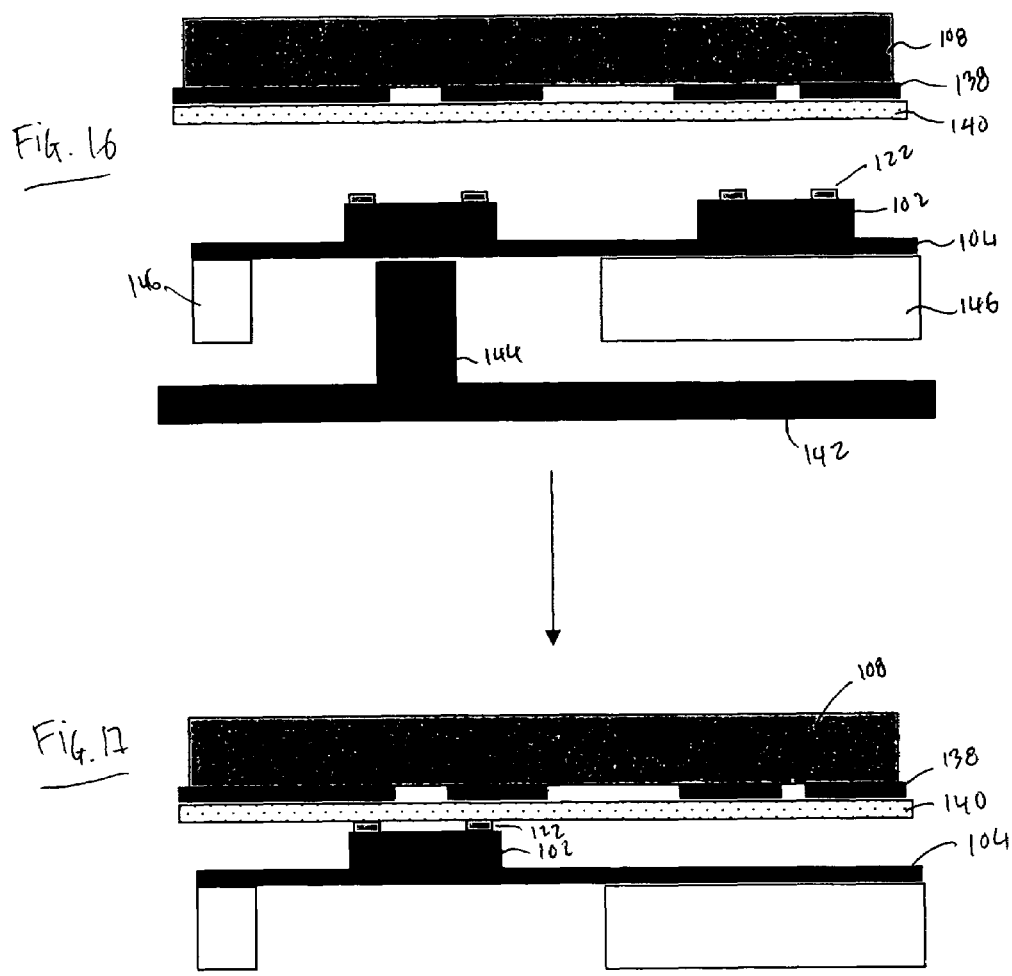

TRANSFER ASSEMBLY FOR MANUFACTURING ELECTRONIC DEVICES

RELATED APPLICATION

This application is related to and claims the benefit of U.S. Provisional Patent application serial number 60/471,422 filed May 16, 2003, which is hereby incorporated by reference in its entirety.

GOVERNMENT RIGHT

The United States government may have certain rights to the present application since the present application may be involved in at least one government contract having the following reference: Defense Microelectronics Activity, Contract DMEA90-03-2-0303.

FIELD

The present invention relates generally to the field of fabricating electronic devices with small functional elements depositing in various substrates and apparatuses comprising these electronic devices.

BACKGROUND

For the fabrication of many electronic devices such as displays or radio frequency identification (RFID) tags, there is a need to distribute functional elements such as integrated circuit chips across large area substrates. The manufacturing of these devices is moving toward using a roll-to-roll processing. In many cases, the majority of the substrate area will not contain active circuitry or functional elements and the functional elements will occupy only a small fraction of the substrates' active areas. Functional elements are typically deposited into a substrate using pick-and-place or a fluidic-self assembly process. These processes are typically expensive. Because of the relatively sparse population of the functional elements on the substrates, it may be advantageous to assemble the functional elements in a different substrate and transfer to the substrates used for the devices.

SUMMARY

Embodiments of the present invention pertain to a method of transferring functional elements deposited in a template substrate to a device substrate.

In one aspect, an exemplary method of transferring includes removing at least one functional element from a second substrate and transferring the functional block to a first substrate. The first substrate includes an adhesive layer deposited on top of the first substrate, and at least one opening. The functional element is transferred from the second substrate into the opening and held in the opening against the adhesive. The method further includes making interconnection to the functional element.

In another aspect, another exemplary method is similar to the method above but the adhesive layer also serves as a dielectric layer. In another aspect, the method is similar to the method above but vias are also created into the adhesive layer to establish electrical connection for the functional element.

In another aspect, an exemplary method includes using FSA to deposit a plurality of functional elements into the second substrate. The functional elements are arranged in a densely packed array and at least one functional block is selected from the array and transferred to the first substrate.

The second substrate is selected from a group consisting of a silicon wafer, a plastic film, a glass sheet, or a multilayer film comprising these materials.

Another aspect of the invention pertains to exemplary systems for forming electronic assemblies. An exemplary system includes a first transfer assembly station that includes a transfer mechanism, a first web line that supports a first substrate which has at least one opening cut therethrough, a second web line that supports a second substrate that includes arrays of functional elements packed therein, and a registration station to align the first web line over the second web line such that the opening is aligned over one functional element. The transfer mechanism is configured to transfer the functional element to the first substrate. The transfer mechanism includes a transfer head that can be an inflatable bladder, pins, or a shaped plate with protrusions.

In another aspect, another exemplary system further includes a treatment station that uses one of heat, chemicals, light, or radiation to activate an adhesive material deposited on the first substrate to enable the transferring of at least one function elements from the second substrate into the openings in the first substrate. The system may also include an X–Y alignment stage for holding the second substrate.

In another aspect, an exemplary method for assembling a device comprises placing a plurality of functional elements in a corresponding plurality of first openings formed in a first substrate and transferring only a portion of the plurality of functional elements to a second substrate having at least one second opening. In yet another aspect, the placing of the functional elements in the corresponding plurality of first openings is accomplished via a fluid self assembly process. A slurry of functional elements is created and dispensed over the first substrate and the functional elements become disposed in the first openings. The transferring of only a portion of the plurality of functional elements to the second substrate comprises preventing at least one functional element from being transferred to the second substrate. In yet another aspect, the method further comprises aligning the first substrate to the second substrate so that only the portion is transferred. And in yet another aspect, the method further includes at least two transferring. The first transferring occurs at a first time and wherein the method further comprises a further transferring of another portion of the plurality of functional elements from the first substrate to the second substrate.

The exemplary methods result in an electronic assembly which, in one exemplary embodiment, a functional element is held against an adhesive film in an opening formed in a device substrate wherein the adhesive film is laminated to the device substrate. The functional element is first deposited in a template substrate and transferred to the device substrate.

BRIEF DESCRIPTION OF THE DRAWINGS

FIG. 1 illustrates an example of punched-through substrate which may be a web substrate (e.g., roll to roll processing system).

FIG. 2 illustrates an example of punched-through substrate (e.g., a web substrate) having an adhesive layer deposited thereon.

FIG. 3 illustrates a re-usable substrate having functional elements deposited therein, for example by using a Fluidic Self-Assembly (FSA) process.

FIG. 4 illustrates an exemplary embodiment of transferring at least one functional element from the re-usable substrate (e.g., there is only a partial transfer of elements from one substrate to another substrate).

FIG. 5 illustrates an exemplary embodiment where at least one functional element has been transferred to the punched-through web substrate shown in FIGS. 1–2.

FIGS. 7–13 illustrate exemplary embodiments of creating electrical contacts to the functional elements.

FIGS. 16–17 illustrate another exemplary embodiment of transferring functional elements from a re-usable substrate to another substrate.

DETAILED DESCRIPTION

Figure 6:
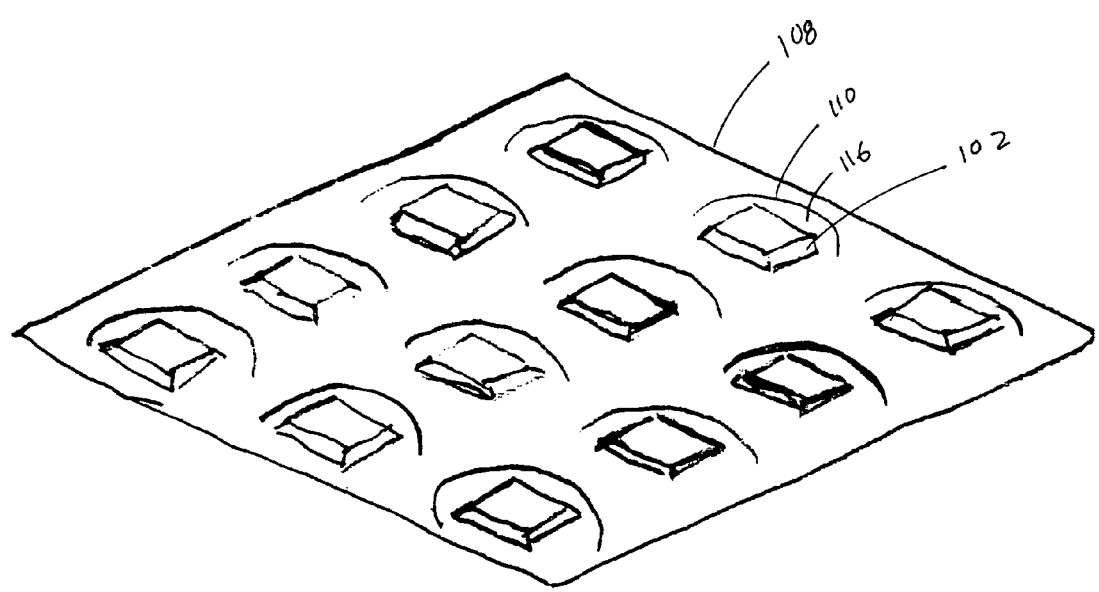
FIG. 6 illustrates a section of a plurality of functional elements transferred to the punched-through web substrate.

In several types of integrated circuit fabrication and application, it is advantageous to form the integrated circuit elements in a densely packed array, and then transfer these elements to another surface, where the spacing and density can be quite different than the spacing and density in the densely packed array.

For example, Fluidic Self-Assembly (FSA) can be used to place functional elements such as integrated circuit elements (e.g., each functional element may be an integrated circuit) in receptor sites in a substrate. If the functional elements are the control elements in a radio frequency identification tag, then to function properly each of the functional elements must be electrically connected to an antenna element. In one embodiment, each of the functional elements is less than 1 mm on a side, while an antenna element is several square centimeters in area. It is possible to perform FSA on a substrate such that one functional elements is deposited on a web area several square centimeters in area, and then forming the antenna on that web. Such a process can be slow, inefficient, and expensive, however, making the FSA process the rate limiting step.

Some embodiments of the present invention relates to improved processes that including using FSA to place functional elements in an area that is approximately 1 square centimeter in area, and providing electrical contact pads on the receiving web. This smaller assembly, called a strap, is then singulated and attached to an antenna, the antenna being several square centimeters in area. The strap assembly is described in a patent application Ser. No. 09/872,985, now U.S. Pat. No. 6,606,247, which is incorporated herein by reference.

In one embodiment, we perform FSA to create a densely-packed array of functional elements, which are placed in receptors spaced very closely together on a second substrate. Each of the functional elements may be an integrated circuit formed in a semiconductor substrate, such as an integrated circuit (IC) which forms part of a radio frequency (RF) Identification tag or ("RFID"). The second substrate can be a plastic film or sheet, it could also be constructed out of an expensive, reusable material that provides superior performance for FSA, such as a silicon wafer. We then perform at least one transfer step that transfers each individual functional element to a first substrate. In the first substrate, the functional elements are spaced further apart and arranged differently than in the initial densely-packed array on the second substrate. The first substrate does not need to be of high quality and expensive so as to be optimal for FSA as the second substrate (and thus the first substrate need not be as expensive as the second substrate).

The transfer process allows for very efficient use of FSA to assemble small integrated circuit elements in a second substrate and then efficiently transfer them to a first substrate. The second substrate is optimized to provide efficient FSA, while the first substrate is optimized for the final form of the application. The first substrate can be a substrate for a device that incorporates the IC elements. Such a process is superior to traditional pick and place methods, in which a robot handles an individual integrated circuit element to place it on one substrate. Additionally, the exemplary embodiments also allow for parallel processing of functional elements (rather than the serial method in pick and place), and can efficiently handle functional elements in the range of 10 microns on a side to 10 mm on a side. The process should increase the throughput of an existing FSA manufacturing process line by up to an order of magnitude.

In one embodiment, functional elements are deposited to a substrate in a two-step process: firstly, use FSA to deposit the functional elements (e.g., blocks) into a second substrate and then, secondly, transfer the blocks from the second substrate to deposit the blocks into a first substrate. As mentioned above, the second substrate typically (but not necessarily in all embodiments) has the functional elements arranged in a densely packed array. The first substrate has the functional elements arranged in the final form that is practical for a particular electronic device or application (such as RFID tag or an electronic display).

In FIG. 3, functional elements 102 are assembled on a second substrate 104 which may be is referred to as a "re-usable substrate" containing receptor sites 106 that are spaced more densely than the final product requires. The functional elements 102 are transferred many at a time to a first substrate 108, which may have a web (substantially continuous) format such as the roll to roll web format which is often used to make paper, etc. The first substrate 108 may have a form of a plastic web on which further lamination and metalization could occur. Alternatively, the functional elements 102 could come straight from a wafer that has integrated circuits formed thereon, as described below.

As illustrated in FIG. 1, the first substrate 108 comprises an array of openings or holes 110 "punched" through the web or material which forms the first substrate. The first substrate 108 may be referred to as a "punched web" in many instances of this discussion. In this example, the hole 110 is completely (rather than a partial opening) through the first substrate. The arrangement of the holes 110 would be the arrangement required of the final product. Prior to the transfer process, an adhesive film 112, which in one embodiment is an adhesive film 112 that could be used as a dielectric material, is laminated to the punched web. During the transfer process, the laminated, punched web is positioned over the filled re-usable substrate with the adhesive film on the top, sticky side down, such that the punched web is between the adhesive on the laminate and the filled re-usable substrate, except where there is a punched hole in the web as illustrated in FIG. 2. The adhesive could be a pressure sensitive adhesive (PSA), a heat-activated adhesive, a chemically-activated adhesive, a microwave or radio-frequency activated adhesive, a photochemically-activated adhesive, a radiation-activated adhesive, or other types of suitable adhesive.

In one embodiment, the receptor sites 106 in the second substrate 104 are arranged in one or more regular patterns designed to match the pattern of the openings 110 in the first substrate 108. In one embodiment, the receptor sites 106 in the second substrate 104 are in one or more arrays designed to match the array pattern of the openings 110 in the first substrate 108. In another embodiment, the receptor sites 106 in the second substrate 104 are in an array in which the pitch between the openings in either of two orthogonal directions is equal to the corresponding pitch of the openings 110 divided by an integer number.

In FIG. 4, a mechanical transfer 114 (pins, deformable bladder, or other devices as described below) is used to pick up the functional elements 102 and transfer them to the first substrate 108. The adhesive film 112 can be a type that can be activated locally heat, light, or other conventional methods. As shown in FIG. 4, only some of the functional elements are transferred at one point in time (rather than all at the same time), and additional transfers may be subsequently performed at later times.

The web may be located with respect to the second substrate 104 such that each hole 110 on the first substrate 108 is above a functional element 102 on the filled re-usable substrate 104. In FIG. 4, to do the transfer process, the adhesive film 112 is pressed through the hole 110 on the first substrate 108 to make contact with at least one functional element 102. When the pressure is removed on the adhesive film 112, the film returns to its original position with respect to the punched web or first substrate 108, and the transferred functional elements 102 are in the holes 110 in the punched web or first substrate 108 as illustrated in FIG. 5. An entire frame, or multiple frames, of functional elements 102 could be transferred at once with this process. FIG. 6 illustrates a section of a transferred frame of functional elements 102 to the first substrate 108.

Once the transfer process is completed, the first substrate 108 is indexed relative to the second substrate 104 forward to the next frame of available (unfilled) punched holes. At the same time, the filled, reusable substrate 104 may be indexed such that another frame of functional elements 102 are ready to be transferred. On the punched web 108 that now contains functional elements 102, there will be a gap 116 in the hole 110 between the side of the hole 110 and the functional elements 102, as seen in FIGS. 5–6. The gap 116 may or may not be filled in. If necessary, the gap 116 can be filled with a UV epoxy or other thermoset resin. Furthermore, if necessary, a laminate could be applied to the back of the first substrate 108 to lock the functional elements 102 into place. Alternatively, it may not be necessary to fill the gap 116 at all.

In some embodiments, the gaps 116 are filled and the first substrate 108 does not include a back laminate to lock the functional elements 102 in place. In some embodiments, the gaps 116 are not filled and the first substrate 108 includes a back laminate, (not shown), which can be made of PSA or a thermal material to lock the functional elements 102 in place. In yet some other embodiments, the gaps 116 are filled and the first substrate 108 includes a back laminate to lock the functional elements 102 in place.

Once the functional elements 102 are transferred to the first substrate, which may be a receiving web, it is usually necessary to provide electrical contacts to one or more contact pads on the functional elements 102 if the functional elements include electrical circuitry which requires an external connection. For the purposes of this discussion, we define the "top" of the functional elements 102 as the side facing up, side 118 (FIG. 3), after it has been deposited (through for example an FSA process) into the reusable, densely-filled substrate 104. The transfer adhesive 112 then adheres to this top functional elements 102 surface 118.

Figure 7:
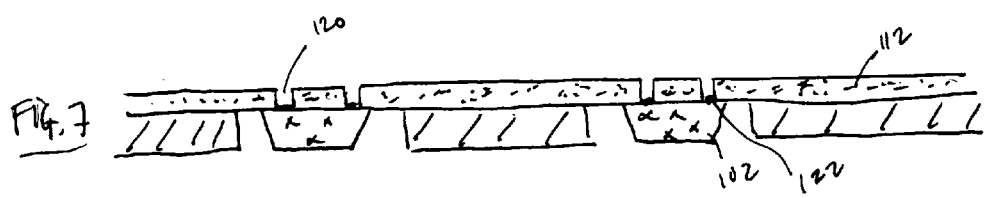
Figure 8:
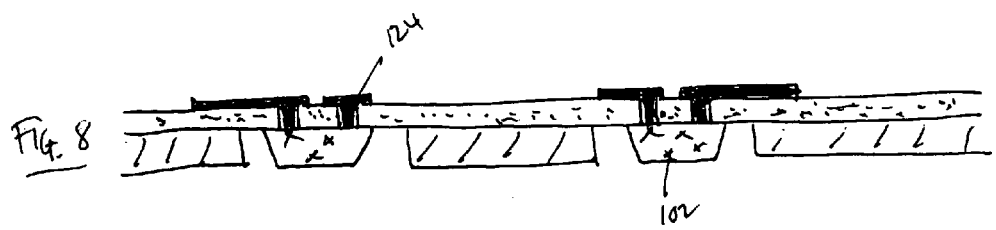

In the case of functional elements 102 in which the contacts are all on the top surface 118, it is necessary to provide a way to form an electrical contact to the contacts once the transfer to the first substrate or receiving web has taken place. One way of providing this contact is to form via holes 120 in the adhesive layer 112 over the contact pads 122 on the functional elements 102, and followed by a metallization process (forming conductive traces 124) to form interconnections as illustrated in FIGS. 7–8. Vias 120 formation can occur by a number of conventional methods, including laser drilling or photolithographic etching. Suitable conductors can include metallic films, conductive polymers, or inks filled with conductive particles.

The metallization 124 can either be a subtractive process (using etching/lithography or laser ablation) on a metal film, or an additive process (such as printing) metal traces.

Via 120 formation and metallization 124 can occur after the transfer process.

Alternatively, the vias 120 could be formed in the adhesive layer 112 before the transferring of the functional elements 102, and the formation of the metallization 124.

In another embodiment, the vias 120 could be formed in the adhesive layer 112 after the adhesive layer 112 has picked up the functional elements 102, but before the actual transfer to the first substrate 108. The formation of the metallization 124 would occur after transfer to the first substrate 108.

Figure 9:
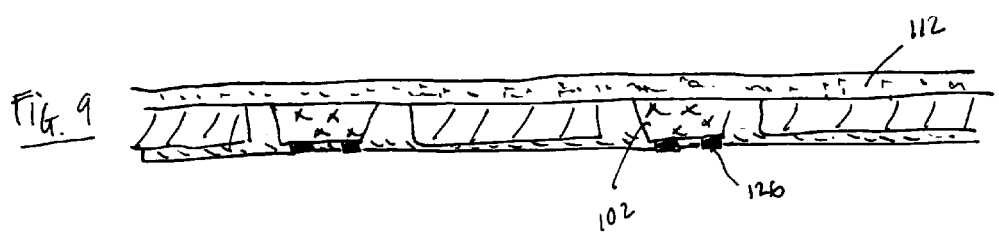

In another embodiment, one or more contact pads 126 will be positioned on the bottom of the functional elements 102 as illustrated in FIG. 9. In this case electrical contact can be made directly onto the functional elements 102 after transfer, as they will be exposed on the surface of the substrate 108.

Alternatively, a thin polymer layer can be laminated or otherwise formed on top of the first substrate 108 containing the functional elements 102, with the purpose of locking in the functional elements 102 onto the first substrate 108, or otherwise protecting them. In this embodiment, the vias 120 can be subsequently formed to allow for contact to the bottom on the functional elements 102, as described above.

Figure 10:
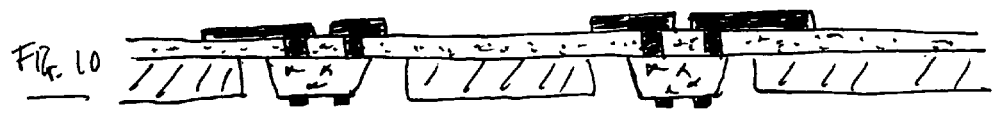

In another embodiment, functional elements 102 contain both top and bottom contacts (122 and 126) as illustrated in FIG. 10. In this case a mixture of the above processes can be used to form contacts.

In another embodiment, the adhesive film 112 can comprise an anisotropically-conductive adhesive, providing for electrical contact through the adhesive film that is essentially self-aligned with the functional elements 102 contact pads. Subsequent electrical interconnection can then be made to the opposing side of the anisotropically conductive adhesive film 112.

For certain applications (such as radio frequency identification tags) it may not be necessary to provide a direct resistive electrical contact, but it may be sufficient to provide a capacitive or inductive electrical contact to the functional elements 102 contact pads. In this case the thickness of the adhesive, and subsequent conductor placement, can be arranged to allow for these types of connections.

In one embodiment, the vias 120 could be drilled through the top layer before transferring the functional elements 102.

Exemplary embodiments of the present invention process can be applied to one or more different types of the functional elements 102. For example, the transfer process described above can be done with one type of the functional elements 102. Then the first substrate or web could be indexed forward to a second transfer station which could transfer into a second set of locations either more of the first type of device, or a second type of device. This index and transfer process could be repeated for as many times as necessary to place all of the desired devices in their respective locations. This ability to repeat the index and transfer process solves at least two potential problems. First, it may be necessary, for either product function or process economics reasons, to have the same devices placed on the web in a pattern that is not conducive to completing in one transfer process step. Second, the product may require the functional elements 102 with different functionality and/or different material. Third, the product may require the functional elements 102 to have different shapes or sizes. For example, the first transfer step could transfer the functional elements 102 with digital circuitry, while the next transfer step could transfer devices with analog circuitry. Alternatively, the first transfer step could transfer the functional elements 102 with RF communication capabilities, while the second transfer step could transfer the functional elements 102 with sensing capabilities. Potentially, additional transfer steps could transfer devices with energy storage and delivery capabilities. In yet another example, the first transfer step could transfer individual pixel drivers for a display, while the second transfer step could transfer a display driver chip IC which drives and controls the pixel drivers. Or the first transfer step could transfer GaAs IC's, while the second transfer step could transfer silicon IC's. There are plenty of additional examples of how having two or more devices would be beneficial. The last example does point out an important feature of the process, which is that it could work with devices fabricated from any material, including but not limited to, silicon, silicon-on-sapphire, silicon-on-insulator, gallium arsenide, silicon carbide, gallium nitride on silicon, etc.

In another embodiment, the transferred material is a diced or otherwise singulated thin film transistor (TFT) circuit on a flexible substrate such as metal foil or high temperature plastic, or a rigid substrate such as glass or quartz.

Whether there are one or multiple transfer steps in the process, after the devices are transferred, there need to be openings, called "vias", for electrical connections to the pads on the tops of the devices if external electrical connections are required for the devices to work. These openings could be made either before the transfer process, or after the transfer process. Before the transfer process, the vias could be made by either laser drilling, wet etching, plasma etching, punching, or mechanically drilling the adhesive film in the appropriate locations to make contact with the devices after they are transferred. The vias could also be made after the transfer process, in which case it is preferable that the adhesive film used in the transfer process be either laser drillable or etchable.

In another embodiment, the adhesive film 112 can be a temporary adhesive. Once the gap is filled with the UV cured polymer or thermoset polymer or thermoplastic resin, the adhesive film can be pealed off. Then the functional elements 102 connections can be made by directly screen printing silver ink onto the functional elements 102 contact pads. This temporary adhesive could be UV release tape. This process could eliminate the need for a via. In the case where it is necessary to reduce the capacitance caused by the metal interconnect over the functional element, tall (5–25um) bumped interconnection pads on the functional elements could be used. The adhesive film would make contact with these bumped pads. The gap filler (UV-cured polymer, thermoset, or thermoplastic resin) would underfill between the adhesive film and the top of the device. Once again, when the adhesive film is removed, bumped metal pads are left, surrounded by a thick film dielectric, and the need for the formation of a via is eliminated.

Options for vias include no via, photo vias with laminate, and laser vias with laminate.

The assembly of the exemplary embodiments could also be created from functional elements 102 (e.g., IC chips) that are thinned and diced in wafer format (e.g., etched and coupled to a handle substrate), and temporarily held in place on a dicing tape or other adhesives. The adhesive laminated, punched web could be placed over the wafer, and an entire frame could be transferred at once. In one embodiment, a substrate 108 with openings 110 and adhesive film 140 laminated to the substrate 108 is placed over the wafer that have the functional elements 102 that are thinned and diced in the wafer format. The adhesive film 140 is then pressed through the openings to cause the functional elements 102 to be transferred over to the substrate 108. To reduce the adhesion of the dicing tape, UV release dicing tape could be used, and the UV exposure could be either a flood exposure, or through a stencil or mask so that only the adhesive touching the chips that are to be transferred is UV-treated.

In an alternative embodiment, one or more of the functional elements 102 are transferred from the wafer that have the functional elements 102 that are thinned and diced in the wafer format (e.g., etched and disposed on or coupled to a handle substrate) onto a template substrate (e.g., a second substrate 104). In one embodiment, the functional elements 102 are singulated, isolated, or separated after being formed into their particular shapes (e.g., thinned). The functional elements 102 are also coupled to or otherwise disposed on the handle substrate which are then transferred onto the template substrate. The functional elements 102 are then transferred again onto a device substrate (e.g., a first substrate 108). In one embodiment, the template substrate is fabricated with a pattern of receptor sites that matches the pattern of functional elements 102 that are formed on the wafer. The template substrate is then placed on the wafer, in one embodiment, with relative alignment such that the functional elements 102 are then released into the template substrate. To reduce the adhesion of the dicing tape, UV release dicing tape could be used, and the UV exposure could be either a flood exposure, or through a stencil or mask so that only the adhesive touching the chips that are to be transferred is UV-treated. As the dicing tape releases the functional elements 102, the elements 102 are released into the template substrate.

The layout of the wafer containing the functional elements 102 is important. For the transfer of many devices at one time, it is preferable to layout the functional elements 102 on the wafer such that the spacing between every i functional elements 102 in the x axis and every j functional elements 102 in the y axis matches the x and y spacing between holes on the punched web 108 to which the devices will be transferred. If such a layout is not convenient or practical, then the transfer of the functional elements 102 could be completed in more than one step, as described above. Analogously, the transfer of two or more different functional elements 102 could be completed in a sequential index and transfer process, as described above.

Another option would be to first cut the wafer in to square dies that are tiled together (pick and place) to make a square area suitable for transfer, then dice the functional elements 102 in the square all together. This would allow the most of the area of a round wafer. It would also avoid the need to layout the wafer in a special way for transfer.

The equipment to accomplish a transfer process from a wafer or from a filled template is relatively similar. First, the equipment needs the appropriate web handling devices to smoothly transfer web into and out of the transfer process area. As described above, the transfer process area comprises one or more transfer process assemblies. Each transfer process assembly consists of the following basic components: 1. A template or wafer holder on a movable stage; 2. The incoming laminated web; 3. A method for positioning the web and the template or wafer with respect to each other; and 4. A transfer head for deforming the adhesive laminate through the web such that it makes contact to the devices on the wafer or in the template.

Figure 14:
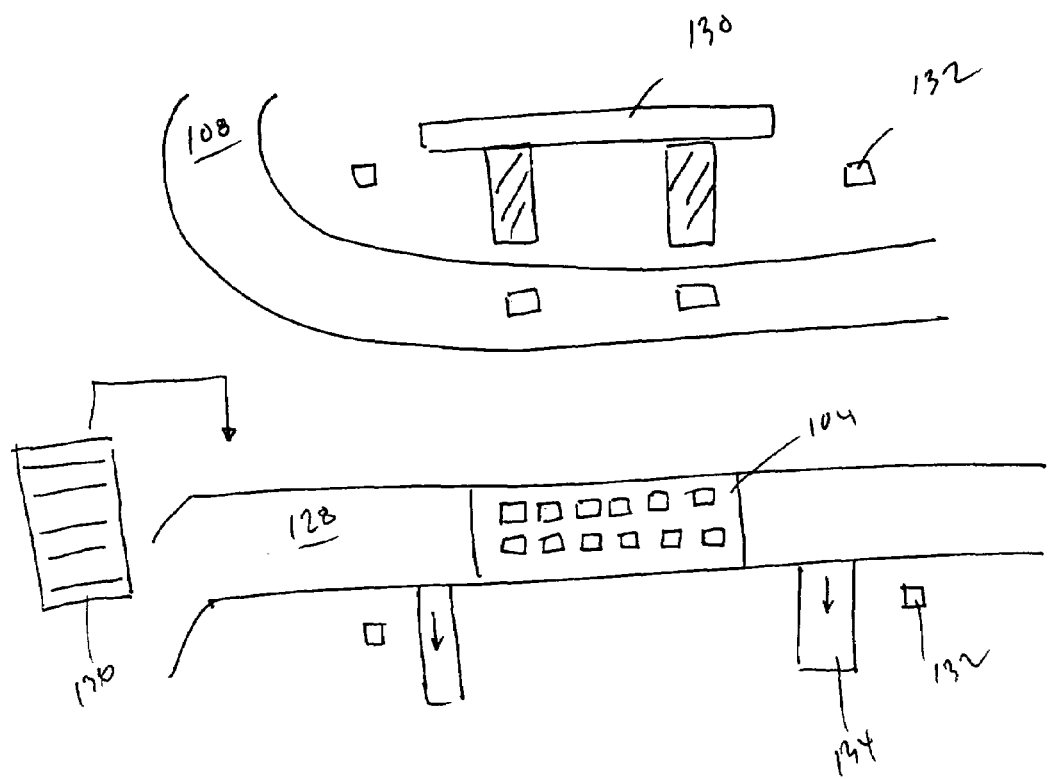
FIG. 14 illustrate an exemplary scheme of a web station that assembles functional elements to the punched through web substrate.

FIG. 14 illustrates that the equipment may include a web line of the first substrate 108, a template 128 for holding the second substrate 104, and a transfer mechanism 130 having transfer heads 136 to allow for the transfer of the functional elements 102 from the second substrate 104 to the first substrate 108. The equipment may also includes one or more registration stations 132 to allow the relative positioning of the first substrate 108 and the second substrate 104. A vacuum station 134 may be used to hold the second substrate 104 in place. A storage 136 may also be included that holds the second substrate 104 that can be transferred onto the web line 128.

The stage for holding the wafer or the template could be a simple x, y stage, which holds the template or the wafer to it by means of a vacuum. This stage could be automatically translated after every transfer step such that another set of devices are ready for transfer. The stage could be fed fresh wafers or templates automatically from a cassette of wafers or templates.

Figure 15:
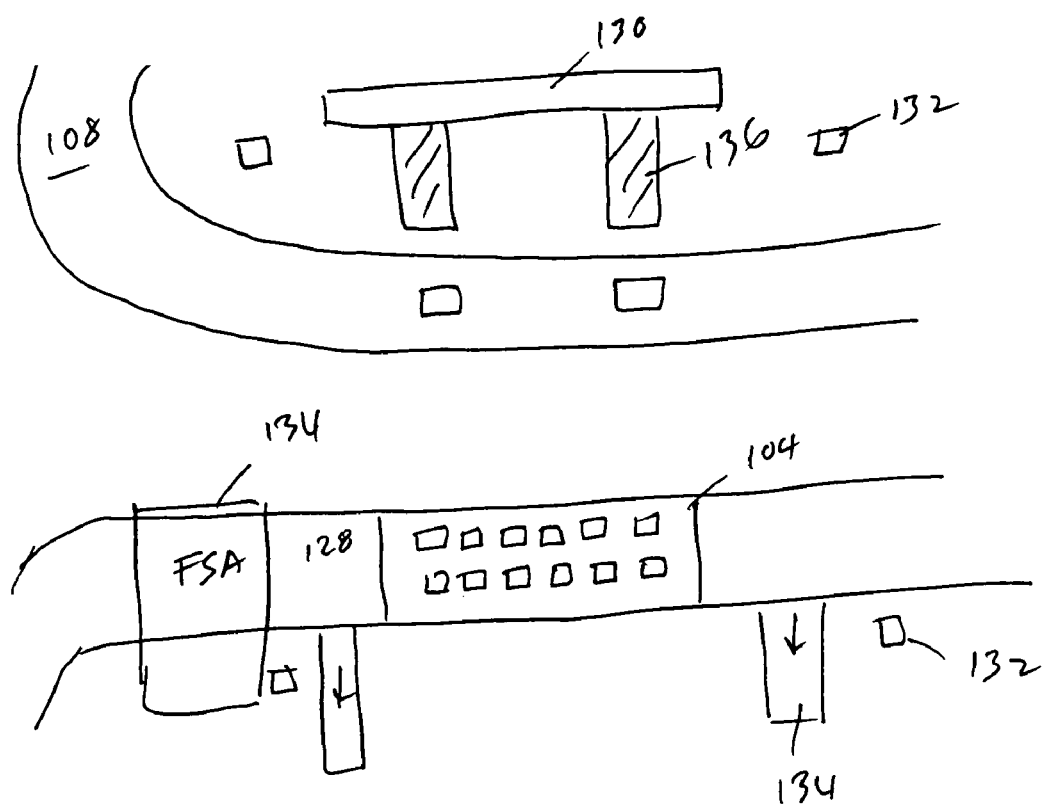
FIG. 15 illustrate another exemplary scheme of a web station that assembles functional elements to the punched through web substrate.

Alternatively, the transfer template could be a filled FSA web in the shape of a belt (which for example, is moved between rolls), which progresses underneath the adhesive laminated transfer web such that a set of IC devices is always ready for transfer as illustrated in FIG. 15. The equipment in FIG. 15 is similar to the equipment in FIG. 14 except an FSA station 135 is included.

The web could be positioned with respect to the transfer template or the IC wafer by the registration station 132 (e.g., a vision system) to align reference marks on the template or wafer with complementary reference marks on the webs. Alternatively, the vision system could align to the devices themselves, or to the punched holes on the laminate web, or both.

The transfer head 136 could take many forms. It could be a set of pins laid out in an arrangement to match the layout of the holes punched in the substrate 104 web. Alternatively, it could be a shaped plate, made out of plastic or metal, with protrusions that match the layout of the holes punched in the substrate 104 web. In yet another form, it could simply be a deformable bladder, which could be deformed with air pressure such that it deforms the adhesive laminate.

For the transfer head 136, it would be preferable to not have the web of the first substrate 108 touch the IC wafer or template except during the transfer step itself. This could be accomplished by having the template or wafer stage have z-motion capability, such that it can move down from the transfer position before the web for the first substrate 108 is indexed. Alternatively, the web could be held above the transfer stage. It could be held at a permanent height above, but close to, the template or wafer stage, or it could have z-axis motion, such that it could be brought into contact or close proximity of the template or wafer stage. Or a separate metal or plastic sheet or film could be placed between the web and the transfer template or wafer to ensure that the sliding web does not come in contact with the template or wafer on the stage.

In alternative embodiments, any of the equipments shown in FIG. 14 or FIG. 15 (or alternative embodiments thereof) can include a filling station (not shown). The filling station that can be used to fill gaps that may be formed in the openings in the first substrate after the functional elements are transferred. The filling station may be equipped with a filler material such as a UV cured polymer or a thermoset polymer or a thermoplastic resin. In addition, the equipment may include an adhesive removal station where the adhesive film (which can be a temporary adhesive film) can be pealed off. In one embodiment, the temporary adhesive is a UV release tape. In these embodiments, the interconnections to the functional elements can be made by directly screen printing silver ink onto the functional elements' contact pads. One advantage for having a temporary adhesive film is that it eliminates the need for vias to establish interconnection to the functional elements.

FIGS. 16–17 illustrate that in a further alternate embodiment, the second substrate 104 is flexible. The functional elements 102 may be deposited into the second substrate 104, either by an FSA-process filled plastic template or devices on flexible dicing tape. The first substrate 108, to which the functional elements 102 are transferred to can be rigid or flexible depending on applications. In this embodiment, the functional elements 102 can be transferred to a first substrate 108, which in one embodiment, is rigid, such as a large or small IC device, silicon wafer, wafer of IC devices, glass, etc. The transferred functional elements 102 can be attached to the first substrate 108 using eutectic solder or other flip-chip interconnect methodologies, or an adhesive layer on the substrate or device as discussed above, or a combination of techniques. During the transfer process, the rigid first substrate 108 is positioned in close proximity to, and facing, the functional elements 102 holding side of the flexible second substrate 104. The functional elements 102 are transferred to the first substrate 108 by deflecting portions of the flexible second substrate 104 such that selected functional elements 102 are brought into contact with and attached to the first substrate 108.

As illustrated in FIG. 16, the second substrate 104 has a plurality of functional elements 102 arranged in a densely packed array. Similar to above, each of the functional elements 102 includes contact pads 122. The second substrate 104 is flexible. The functional elements 102 may be coupled to the second substrate 104 using methods such as FSA. The first substrate 108, which in one embodiment, is rigid, includes a patterned conductive leads 138. The patterned conductive leads can be an antenna leads in one example. The first substrate 108 can be flexible. In one example, the first substrate 108 is a substrate that can support an antenna, such as one used for an RF ID tag. The first substrate 108 thus can include antenna lead formed thereon. At least part of the antenna lead may be the conductive leads 138 shown in FIG. 16.

As illustrated in FIG. 16, an adhesive layer 140 is disposed over the patterned conductive lead 138. When the functional elements 102 are transferred to the first substrate 108, the contact pads 122 will make electrical contacts to the conductive leads 138 either through vias formed into the adhesive layer 140 or by the conductivity characteristic of the adhesive layer 140. The adhesive layer 140 may be electrically conductive and/or anisotropically conductive such that it is only conductive in one direction, (e.g., Z-direction). That way, the adhesive layer 140 will allow electrical connection between the conductive lead 138 on the first substrate and the contact pads 140 on the functional elements 102.

In FIG. 16, a transfer mechanism 142 including at least one transfer pin 144 is place under the second substrate 104. The second substrate 104 is placed or held on a vacuum station 146 to hold the second substrate 104 in place. The transfer mechanism 142 drives the transfer pin 144 into the second substrate 104, which is flexible. The transfer pin 144 is able to push the functional elements 102 up toward the first substrate 108 to transfer the functional elements 102 onto the first substrate 108. FIG. 17 illustrates the functional elements 102 having been transferred onto the first substrate 108.

In the alternative embodiment, the conductive leads 138 have adhesive characteristic such that the adhesive layer 140 can be eliminated. In this embodiment, at least the portion of the conductive leads 138 that will make contact to the contact pads 122 have adhesive material such that the can adhere to the contact pads 122 and allow mechanical as well as electrical coupling.

While the preceding discussions have focused on the use of a transfer method with the functional elements 102 such as integrated circuits assembled using FSA, it is clear to those skilled in the art that such a transfer process can be used to assemble other types of functional elements that are formed in arrays on one substrate, and then transferred to another substrate.

For example, it is difficult and costly to form thin film transistors over large areas on flexible substrates. Typically, processing equipment gets very expensive for large area treatments, and few substrates can withstand the processing temperatures and conditions necessary to form thin film transistors. One could inexpensively form small circuit elements on standard, small-to-medium sized substrates, singulated the circuit elements, and then use this transfer process to spread the devices over a large area, or place them on a flexible substrate.

As one example, it is possible to form amorphous or polysilicon TFTs on stainless steel foils. Such devices can be formed relatively inexpensively today by using standard semiconductor or flat panel display processing equipment. For example, a group at Princeton University routinely forms amorphous silicon TFTs on four inch steel "wafers" (or flats). The equipment cost is prohibitive, however, to form a similar TFT array on a substrate that is 1 meter across.

Using a version of the transfer method described here, however, TFTs could be formed on a wafer, flat, or ribbon on one substrate, and transferred in a simple fashion to another. For example, a ribbon of TFTs could be attached to a carrier substrate and then singulated. The purpose here is to simply hold the singulated transistor elements in place. The transfer tool described here could then select TFTs off of this densely-packed ribbon and transfer them to the final substrate, placing them in an arbitrary pattern and spacing. If the adhesive layer here is an anisotropically conductive adhesive, then interconnection to the TFT (with the steel underlayer still in place) is easily done through the adhesive. Alternatively, vias through a nonconductive adhesive can be used.

Transfer methods have been described in the past, typically by providing some sort of sacrificial underlayer on the primary substrate, which is etched away to free a thin, fragile active circuit element. In this case, we take advantage of the ability to slit, cut, or otherwise singulated the steel foil and then transfer the element as a whole.

Likewise, this approach could be extended to other substrates that could be singulated. Other circuit elements (besides integrated circuits), that could be transferred, include active elements, passive elements, or even other functional systems, such as sensors (e.g., chemical or biological sensors), MEMs, VCSELS, photodiodes, mechanical elements, thin film transistors, passive electrical elements, capacitors, inductors, resistors, diodes, optical elements, photodiodes, light emitters, microprocessors, memory structures, radio frequency transceivers, communications elements, power sources, energy storages, electromagnetic radiation emitting elements, electromagnetic radiation reflecting elements, and display elements (e.g., display pixel elements and display drivers), to name a few.

It is to be appreciated that many of the embodiments discussed the transferring of the functional elements from one substrate (e.g., substrate 104) to another substrate (e.g., substrate 108) in a web format. But, the embodiments are similarly applicable to other format such as sheet format. Thus, instead of the substrate 104 and the substrate 108 being in the web formats (e.g., roll-to-roll), the substrate 104 and the substrate 108 are in sheet forms.

Some of the embodiments described can be used to form the strap assembly described in patent application Ser. No. 09/872,985, now U.S. Pat. No. 6,606,247 which is hereby incorporated by reference.

We claim:

1. A method for assembling a device comprising:
    placing a functional element in a first opening formed in a template substrate using a fluidic self-assembly process (FSA) and a web process; and
    transferring the functional element to a device substrate having a second opening formed therein wherein the functional element is held within the second opening and against an adhesive film coupled to the top of the device substrate, wherein said transferring includes pressing the adhesive film through the second opening so that an adhesive side of the adhesive film adheres to the functional element through the second opening and transfers the functional element out of the first opening in the template substrate into the second opening of the device substrate.

2. The method of claim 1 further comprising:
    forming at least one interconnection to the functional element.

3. The method of claim 1 wherein the adhesive film is at least one of a dielectric film, a pressure sensitive adhesive, a heat-activated adhesive, chemically-activated adhesive, microwave frequency activated adhesive, radio frequency activated adhesive, radiation-activated adhesive, a laser ablatable adhesive, and an anisotropically-conductive adhesive and wherein the adhesive film is placed over the device substrate and wherein said second opening is formed completely through the device substrate.

4. The method of claim 3 wherein the adhesive film is a dielectric film and the method further comprises:
    forming a via through the dielectric film to allow for an electrical connection to the functional element.

5. The method of claim 4 further comprising:
    forming an electrical connection to the functional element.

6. The method of claim 1 further comprising:
    forming a conductive trace on a surface of the device substrate; and interconnecting the conductive trace to the functional element.

7. The method of claim 1 wherein the conductive trace is formed on top of the adhesive film.

8. The method of claim 6 wherein the interconnecting of the conductive trace to the functional element is accomplished through a via created in the adhesive film.

9. The method of claim 6 wherein the interconnecting of the conductive trace to the functional element is accomplished through the adhesive film, wherein the adhesive film is an anisotropically conductive adhesive.

10. The method of claim 1 further comprising:
forming an antenna trace on the surface of the device substrate; and
interconnecting the antenna trace to the functional element.

11. The method of claim 10 wherein the antenna trace is formed on top of the adhesive film.

12. The method of claim 10 wherein the functional element is a radio frequency control element.

13. The method of claim 10 wherein the interconnecting of the conductive trace to the functional element is accomplished through a via created in the adhesive film.

14. The method of claim 10 wherein the interconnecting of the conductive trace to the functional element is accomplished through the adhesive film, wherein the adhesive film is an anisotropically-conductive adhesive.

15. The method of claim 1 further comprising:
placing, using said FSA process, a plurality of said functional elements in a plurality of said first openings formed in the template substrate;
transferring at least one functional element selected from the plurality of functional elements to the second opening formed in the device substrate.

16. The method of claim 15 wherein the plurality of first openings in the template substrate are in one or more regular patterns designed to match a pattern of the second openings in the device substrate.

17. The method of claim 15 wherein the plurality of first openings in the template substrate are in one or more arrays designed to match an array pattern of the second openings in the device substrate.

18. The method of claim 15 wherein the plurality of first openings in the template substrate are in an array in which a pitch between the first openings in an orthogonal direction is equal to a corresponding pitch of the second openings in the device substrate.

19. The method of claim 15 wherein the plurality of first openings in the template substrate are in an array in which a pitch between the first openings in an orthogonal direction is equal to a corresponding pitch of the second openings divided by an integer number.

20. The method of claim 1 wherein the template substrate is selected from a group consisting of a silicon wafer, a plastic film, a glass sheet, and a multilayer film comprising a combination thereof.

21. The method of claim 1 wherein functional element is an integrated circuit.

22. The method of claim 1 further comprising:
filling a gap in the second opening in the device substrate.

23. The method of claim 22 wherein filling a gap in the second opening in the device substrate is accomplished with at least one of UV-curable epoxy, and thermoset resin.

24. The method of claim 1 further comprising:
laminating the adhesive film over a surface of the device substrate prior to the transferring of the functional element.

25. The method of claim 1 further comprising:
laminating additional films over a surface of the device substrate.

26. The method of claim 1 further comprising:
forming at least one of a top contact and a bottom contact on the functional element.

27. The method of claim 1 further comprising:
forming electrical interconnection to at least one of the top contact and the bottom contact on the functional element.

28. A method for assembling a device comprising:
transferring a first functional element to a device substrate having a first opening formed therein, the first functional element is held within the first opening and against an adhesive film coupled to the top of the device substrate and the first functional element is transferred to the first opening from a first template substrate having the first functional element deposited therein; and
transferring a second functional element to the device substrate having a second opening formed therein, the second functional element is held within the second opening and against the adhesive film coupled to the top of the device substrate and the second functional element is transferred to the second opening from a second template substrate having the second functional element deposited therein; wherein
transferring the first functional element to the first opening comprises pressing the adhesive film through the first opening so that an adhesive side of the adhesive film adheres to the first functional element and transfers the first functional element out of the first opening in the template substrate into the first opening of the device substrate transferring of the first functional element tc the device substrate; and
transferring the second functional element to the second opening comprises pressing the adhesive film through the second opening so that an adhesive side of the adhesive film adheres to the second functional element and transfers the second functional element out of the second opening in the second template substrate into the second opening of the device substrate.

29. The method of claim 28 wherein the first functional element and the second functional element is at least one of different material from one another, different functionality from one another, different shape from one another, and different size from one another.

30. The method of claim 28 wherein the first functional element and the second functional element is selected from a group consisting of thin film transistor, passive electrical element, capacitor, inductor, resistor, diode, optical element, photodiode, light emitter, and microelectronic mechanical system (MEMS), microprocessor, memory structure, radio frequency transceiver, communications element, sensor, power source, energy storage, electromagnetic radiation emitting element, electromagnetic radiation reflecting element, display driver, display pixel element, and display element.

31. The method of claim 28 wherein the first functional element is deposited in the first template substrate using fluidic-self assembly processing.

32. The method of claim 28 wherein the second functional element is deposited in the second template substrate using fluidic-self assembly processing.

33. A method for assembling a device, the method comprising:

placing a plurality of functional elements in a corresponding plurality of first openings formed in a first substrate;

transferring only a portion of said plurality of functional elements to a second substrate having at least one second opening, wherein an adhesive film is coupled to the top of said second substrate and having at least a portion exposed in said at least one second opening in said second substrate and wherein said transferring comprises pressing said adhesive film through said second opening such that an adhesive side of said adhesive film adheres to the portion of said plurality of functional elements and transfer the portion of said plurality of functional elements out of its location in the plurality of first openings in the first substrate to said at least one second opening in the second substrate.

34. The method of claim 33 wherein the placing comprises a fluid self assembly process wherein a slurry of functional elements is created and dispensed over the first substrate and the functional elements become disposed in the first openings; and wherein the transferring comprises preventing at least one functional element from being transferred to the second substrate.

35. The method of claim 33 further comprising:
aligning the first substrate to the second substrate so that only the portion is transferred.

36. The method of claim 33 wherein the transferring occurs at a first time and wherein the method further comprises a further transferring of another portion of the plurality of functional elements from the first substrate to the second substrate.

37. The method of claim 1 wherein the adhesive film is a temporary adhesive film.

38. The method of claim 37 further comprise filling a gap in the second opening in the device substrate and removing the adhesive film.

39. The method of claim 28 wherein the adhesive film is a temporary adhesive film.

40. The method of claim 39 further comprising:
filling a gap in the second opening in the device substrate and removing the adhesive film.

41. The method of claim 7 wherein the interconnecting of the conductive trace to the functional element is accomplished through a via created in the adhesive film.

42. The method of claim 7 wherein the interconnecting of the conductive trace to the functional element is accomplished through the adhesive film, wherein the adhesive film is an anisotropically conductive adhesive.

43. A method for assembling a device comprising:
transferring a functional element to a device substrate having an opening formed therein wherein the functional element is held within the opening and against an adhesive film coupled to the device substrate, and wherein the functional element is transferred from a plurality of functional elements that are disposed on a handle substrate format and temporarily held in place on the handle substrate, wherein the adhesive film is coupled to the top of said device substrate and having at least a portion over the opening exposed to contact said functional element and wherein said transferring comprises pressing said exposed adhesive film over the opening toward said handle substrate such that an adhesive side of said adhesive film adheres to said functional element and transfers said functional element disposed on the handle substrate into the opening of said device substrate.

44. The method of claim 43 further comprises releasing the functional element from the handle substrate.

45. The method of claim 43 further comprising:
interconnecting a conductive trace to the functional element.

46. The method of claim 45 wherein the conductive trace is one of formed on top of the adhesive film and formed on a surface of the device substrate.

47. The method of claim 45 wherein the interconnecting of the conductive trace to the functional element is accomplished through a via created in the adhesive film.

48. The method of claim 45 wherein the interconnecting of the conductive trace to the functional element is accomplished through the adhesive film, wherein the adhesive film is an anisotropically conductive adhesive.

49. The method of claim 43 further comprising:
interconnecting an antenna trace to the functional element.

50. The method of claim 49 wherein the antenna trace is one of formed on top of the adhesive film and formed on a surface of the device substrate.

51. The method of claim 49 wherein the functional element is a radio frequency control element.

52. The method of claim 49 wherein the interconnecting of the conductive trace to the functional element is accomplished through a via created in the adhesive film.

53. The method of claim 49 wherein the interconnecting of the conductive trace to the functional element is accomplished through the adhesive film, wherein the adhesive film is an anisotropically-conductive adhesive.

54. A method for assembling a device comprising:
transferring a functional element to a first opening in a template substrate, the first opening selected from a set of openings formed on the template substrate, the functional element selected from a set of functional elements that are disposed on a handle substrate and temporarily held in place on the handle substrate, the set of openings having a pattern matching the pattern of the set of functional elements on the handle substrate; and transferring the functional element from the first opening to a second opening formed therein in a device substrate, the device substrate having an adhesive film coupled thereto, the adhesive film holding the functional element against the second opening;

wherein the adhesive film is coupled to the top of said device substrate and having at least a portion exposed to contact said functional element and wherein said transferring comprises pressing said adhesive film toward said handle substrate such that an adhesive side of said adhesive film adheres to said functional element and transfers the functional element from the handle substrate to said device substrate.

55. The method of claim 54 further comprises releasing the functional element from the handle substrate.

56. The method of claim 54 further comprising:
interconnecting a conductive trace to the functional element.

57. The method of claim 56 wherein the conductive trace is one of formed on top of the adhesive film and formed on a surface of the device substrate.

58. The method of 56 wherein the interconnecting of the conductive trace to the functional element is accomplished through a via created in the adhesive film.

59. The method of claim 56 wherein the interconnecting of the conductive trace to the functional element is accomplished through the adhesive film, wherein the adhesive film is an anisotropically conductive adhesive.

60. The method of claim 54 further comprising:
   interconnecting an antenna trace to the functional element.

61. The method of claim 60 wherein the antenna trace is one of formed on top of the adhesive film and formed on a surface of the device substrate.

62. The method of claim 60 wherein the functional element is a radio frequency control element.

63. The method of claim 60 wherein the interconnecting of the conductive trace to the functional element is accomplished through a via created in the adhesive film.

64. The method of claim 60 wherein the interconnecting of the conductive trace to the functional element is accomplished through the adhesive film, wherein the adhesive film is an anisotropically-conductive adhesive.

* * * * *